United States Patent [19]  
Gartner et al.

[11] 4,248,688  
[45] Feb. 3, 1981

[54] ION MILLING OF THIN METAL FILMS

[75] Inventors: Helmut M. Gartner; Steve I. Petvai, both of Wappingers Falls; Homi G. Sarkary, Hopewell Junction; Randolph H. Schnitzel, Newburgh, all of N.Y.

[73] Assignee: International Business Machines Corporation, Armonk, N.Y.

[21] Appl. No.: 71,649

[22] Filed: Sep. 4, 1979

[51] Int. Cl.³ ............................................. C23C 15/00
[52] U.S. Cl. ................................. 204/192 E; 156/643
[58] Field of Search .................... 204/192 E, 192 EC; 156/643

[56] References Cited

U.S. PATENT DOCUMENTS

| 3,271,286 | 9/1966 | Lepselter | 204/192 |
|---|---|---|---|
| 3,642,548 | 2/1972 | Eger | 156/8 |
| 3,770,606 | 11/1973 | Lepselter | 204/192 |
| 3,860,783 | 1/1975 | Schmidt et al. | 219/121 EM |
| 3,975,252 | 8/1976 | Fraser et al. | 204/192 |
| 4,135,998 | 1/1979 | Gniewek et al. | 204/192 E |

OTHER PUBLICATIONS

J. L. Vossen and W. Kern, editors, Thin Film Processes, Academic Press, New York, 1978.

Primary Examiner—G. L. Kaplan  
Assistant Examiner—William Leader  
Attorney, Agent, or Firm—David M. Bunnell

[57] ABSTRACT

Metals such as platinum and palladium are preferentially removed in the presence of their metal silicides by ion milling in a noble gas atmosphere such as argon. The process can be used on semiconductor chips to remove excess platinum after platinum silicide has been formed in the contact holes.

9 Claims, 1 Drawing Figure

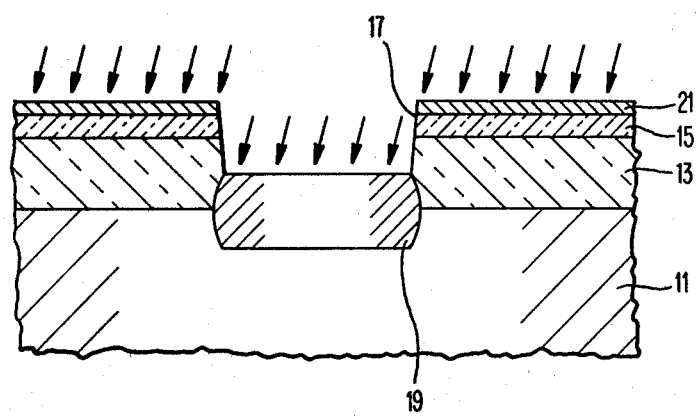

ION MILLING OF THIN METAL FILMS

BACKGROUND OF THE INVENTION

One extensively used metallurgy for providing the ohmic contacts and interconnections in present integrated circuitry involves the use of a layer of a metal silicide, such as platinum silicide, in the contact holes which makes direct contact with the silicon substrate and a layer of aluminum over the platinum silicide. This layer of aluminum is in contact with a second aluminum layer pattern on the insulative layer over the semiconductor substrate which provides the interconnections. The reason that platinum silicide has been used in the contact holes is that aluminum has been found to make less than satisfactory direct ohmic contacts with silicon semiconductor substrates. Such platinum silicide contacts are also used to form Schottky barrier diodes.

Generally, in the process of forming the platinum silicide contacts, a relatively thin layer of a patterned dielectric or insulating film on a silicon semiconductor substrate is provided with contact openings in those areas where a contact to the silicon is to be formed. A thin layer of platinum is deposited over the entire surface by any conventional deposition technique, such as vapor deposition or sputtering. A short term heat treatment is then used to cause the platinum in the contact holes to combine with the silicon to form the platinum silicide. The uncombined platinum layer on top of the dielectric film must then be removed so as to retain the platinum silicide in the contact holes.

The removal of uncombined platinum has been conventionally accomplished by wet etching with etchants such as aqua regia. (See U.S. Pat. Nos. 3,271,286, 3,855,612, 3,956,527, 3,968,272 and 3,995,301). Drawbacks of the use of such etchants are the prospect of contamination by the various etchants, lack of any substantial differentiation in etching rates of the platinum and its silicide in the absence of an oxide layer, as well as associated handling, rinsing and drying operations.

The sputter etching of platinum has also been known (see for example, U.S. Pat. Nos. 3,271,286 and 3,975,252). The problem of similar sputter etch rates for platinum (about 95 Å/min.) and platinum silicide (about 80 Å/min.) has been improved upon by the process of U.S. Pat. No. 4,135,998 in which an increased differentiation of the sputter etch rate of platinum can be obtained, relative to the sputter etch rate of platinum silicide, by sputter etching in an ambient of a rare gas containing at least 1% by volume of oxygen or nitrogen, and preferably an ambient of argon containing 10% by volume of oxygen.

BRIEF SUMMARY OF THE INVENTION

It has now been discovered that a ion milling process in an inert gas ambient will give cleaner, faster removal of metals such as platinum and an enhanced metal-to-metal silicide relative etch rate so that the metal silicide is not substantially effected. The ion milling process is also field and plasma environment free so that the semiconductor devices are not subjected to field effects during the etching.

In accordance with this invention there is provided a process of removing metals in the presence of their silicides comprising ion milling the metal and the metal silicide in an ambient comprising a noble gas, whereby the metal is removed at a rate substantially greater than the metal silicide.

DESCRIPTION OF THE DRAWING

FIG. 1 is a schematic cross section of a semiconductor device illustrating the ion milling of a platinum layer in the presence of a platinum silicide contact.

DETAILED DESCRIPTION

The technique of ion milling employs an energetically controlled parallel (within ±5°) beam of ions which is produced by an ion gun within which the ions are accelerated by a large DC voltage. The substrate from whose surface the material is to be removed is placed in a vacuum chamber in the path of the ion beam whose angle of incidence on the substrate can be varied, preferably by tilting and/or rotating the substrate. A suitable apparatus for conducting the etching process of the invention is illustrated, for example, in the article "Cleaning of Vias by Ion Milling" by S. I. Petvai et al. *Thin Solid Films*, 53 (1978) pages 111-116, FIG. 2 at page 112.

Turning now to FIG. 1, the removal of platinum in the presence of platinum silicide in a typical semiconductor contact formation process is illustrated at a suitable processing stage for the utilization of this invention.

The semiconductor substrate 11, which would usually be silicon, has a relatively thin layer 13 of an insulating dielectric, usually silicon dioxide, on its upper surface and on top of the silicon dioxide a second insulating dielectric layer 15 of silicon nitride. The layers are patterned to provide an opening 17 to accommodate the metal silicide contact 19. The platinum silicide contact 19 is formed by first depositing a thin film of platinum over the entire surface of the semiconductor substrate by evaporation or sputtering techniques so that it covers the exposed silicon in the contact opening 17 and also the top dielectric layer to a thickness for example of about 450±15 Å. The platinum coated substrate is then sintered for about 20 minutes at 550° C. which results in a combination of the platinum in the contact opening 17 with the exposed silicon of substrate 11 to form platinum silicide region 19. The remainder of the platinum layer 21 remains unaffected, e.g., uncombined with silicon or insulating layers 13 and 15. The platinum silicide in reacting with a silicon becomes thicker so that the platinum silicide layer 19 after sintering, has a thickness from about 750 to 1300 Å. Although the invention is illustrated here using platinum as the noble metal, it should be understood that other metals which react with silicon to form metal silicides for electrical contacts such as palladium (palladium-silicide), nickel (nikel-silicide) and zirconium (zirconium-disilicide) can be used in place of platinum and ion milled by the process of the invention. The semiconductor substrate 11, which is usually in the form of a silicon wafer, is then placed in the ion milling chamber to remove the unsintered platinum on the top of the dielectric layer. It has been found that at a preferred pressure range in argon of about 2 to $4 \times 10^{-4}$ torr, an acceleration voltage of about 1,000 volts and acceleration current of from about 70 to 90 milliamperes, the platinum removal rate reaches a maximum of about 600 Å per minute using an angle of incidence of the ion beam on the surface of the substrate of about 30° from the vertical. Under these conditions the attack of platinum silicide is minimized being in the range of only about 20 to 40 Å per minute so that the platinum layer can be completely removed without significantly reducing the thickness of the platinum silicon layer. Other angles of incidence can be employed but produce somewhat lower platinum to platinum silicide etch rate ratios. For example, at an angle of incidence of about 15° the removal rate of platinum was about 220 Å per minute and the removal rate of platinum silicide was 80 Å per minute. At an angle of incidence of about 45° the removal rate of platinum was about 400 Å per minute and the removal rate of platinum silicide about 55 Å per minute.

The pressure range of $2\text{-}4\times10^{-4}$ torr is preferred because at pressures of about $1\times10^{-4}$ torr or in the range of 7 to $9\times10^{-5}$ torr the platinum etch rate is reduced to only about 100 to 150 Å per minute. Other noble gases beside argon can be used such as neon, krypton, xenon and mixtures thereof. Although it is possible to obtain favorable ion milling ratios between platinum and platinum silicide in other than a noble gas atmosphere, the platinum removal rate is very low, for example, being only in the range of 100 to 250 Å per minute where oxygen is present. A preferred range of acceleration voltages to achieve practical removal rates is from about 800 to 2,000 volts.

With the optimum conditions of acceleration voltage, current, atmosphere and angle of incidence, the relative removal rate of platinum to platinum silicide is at least about 15 to 1 and can be as high as about 30 to 1 so that the platinum silicide contact thickness change is negligible by the process of the invention. The etched substrates have excellent platinum silicide contact resistance. The dry process is not subject to the disadvantages of wet etching with aqua regia where a thin layer of silicon dioxide formed on the top of the platinum silicide is what serves to protect it from etching. If this oxide layer is cracked or it contains pinholes, etching or scalloping of the platinum silicide occurs during wet etching which adversely impacts the contact properties. During the milling process, the induced substrate temperature is below 200° C.

Following the etching of the platinum the contact formation process is then continued, for example, by evaporation of a chromium barrier layer to prevent aluminum penetration into the silicon, followed by the aluminum metallurgy.

Palladium was found to be preferentially etched in the presence of palladium-silicide (3:1 ratio) even in ion milling apparatus which did not provide preferred conditions of acceleration voltage (200 V), current (15 ma) and angle of incidence (vertical) under which conditions low removal rates of palladium (150 Å/min) occurred. Based upon this data, under preferred conditions, it is projected that 500 angstroms of palladium could be etched in less than a minute without significant attack of the palladium-silicide.

The process of the invention provides a clean and controllable removable of excess platinum or other silicide contact forming metal with negligible attack and no scalloping of the platinum or other metal silicide contacts. Rapid removal of unreacted metal is possible with removal rates in the range of 600 Å per minute so that the usual metal layer thicknesses of $450\pm150$ Å can be completely removed in a processing time of no more than two minutes. The removal occurs in a plasma and field free environment so that FET semiconductor devices, whose performance can be adversely affected by such plasma and fields, can be processed without extra precautions or annealing steps.

Having thus described our invention, what we claim as new, and desire to secure by Letters Patent is:

1. A process for removing a metal in the presence of its silicide comprising ion milling the metal and the metal silicide in an atmosphere consisting essentially of a noble gas at a pressure range of from about $2\text{-}4\times10^{-4}$ torr with the angle of incidence of the ion milling on the metal being from about 15° to 45° from the vertical, whereby the metal is removed at a rate of at least about three times the rate of removal of the metal silicide.

2. The process of claim 1 wherein the atmosphere consists of argon gas.

3. The process of claim 1 wherein the angle of incidence is about 30°.

4. The process of claim 1 wherein the ion milling is at an acceleration voltage of from about 800–2,000 volts and the accelerator current of from about 70 to 90 milliamperes.

5. The process of claim 1 wherein the metal is platinum and the metal silicide is platinum silicide.

6. The process of claim 5 wherein the noble gas is argon, the angle of incidence of the ion beam is about 30°, the acceleration voltage is about 1000 volts and the acceleration current is from about 70 to 90 milliamperes whereby the platinum is removed at a rate of about 600 Å per minute and the platinum silicide is removed at a rate of about 20–40 Å per minute.

7. The process of claim 1 wherein the metal is palladium and the metal silicide is palladium silicide.

8. A process of removing a platinum layer from the surface of an insulating layer on a semiconductor substrate in the presence of a platinum silicide contact layer on the surface of said semiconductor substrate comprising ion milling the platinum and the platinum silicide in an atmosphere consisting essentially of a noble gas at a pressure of about $2\text{-}4\times10^{-4}$ torr with an ion beam whose angle of incidence on the platinum and platinum silicide layers is about 30° from the vertical at an acceleration voltage of about 1000 volts and an acceleration current of about 70 to 90 milliamperes whereby the platinum is removed at a rate of about 600 Å per minute and the platinum silicide is removed at a rate of about 20–40 Å per minute.

9. The process of claim 8 wherein the induced substrate temperature during the ion milling is below 200° C.

* * * * *